United States Patent [19]

Slemmer

[11] 4,403,158

[45] Sep. 6, 1983

[54] TWO-WAY REGULATED SUBSTRATE BIAS GENERATOR

[75] Inventor: William C. Slemmer, Colorado Springs, Colo.

[73] Assignee: Inmos Corporation, Colorado Springs, Colo.

[21] Appl. No.: 264,375

[22] Filed: May 15, 1981

[51] Int. Cl.3 ...................... H03L 5/00; H03K 17/687

[52] U.S. Cl. ................................ 307/297; 307/296 A

[58] Field of Search ........................ 307/296, 297, 304

[56] References Cited

U.S. PATENT DOCUMENTS

| | | | |
|---|---|---|---|
| 4,229,667 | 10/1980 | Heimbigner et al. | 307/200 B X |
| 4,307,333 | 12/1981 | Hargrove | 307/297 X |
| 4,311,923 | 1/1982 | Lüscher et al. | 307/297 X |
| 4,322,675 | 3/1982 | Lee et al. | 307/297 X |
| 4,336,466 | 6/1982 | Sud et al. | 307/297 |

OTHER PUBLICATIONS

Harroun, "Substrate Bias Voltage Control", *IBM Tech. Disc. Bull.,* vol. 22, No. 7, 12-1979, pp. 2691-2692.

*Primary Examiner*—Larry N. Anagnos
*Assistant Examiner*—David R. Hudspeth
*Attorney, Agent, or Firm*—Cook, Wetzel & Egan

[57] ABSTRACT

An improved substrate bias generator for MOS integrated circuits is described. The generator includes circuitry for generating two trains of periodic pulses which are approximately phase opposite, one of the pulse trains being slightly delayed as compared to the other pulse train. The two pulse trains are applied to a pumping circuit which generates a target voltage and initially transfers a positive charge into the substrate, and thereafter transfers a positive charge out of the substrate. The positive charge transferred out of the substrate is greater than the positive charge transferred into the substrate when the absolute value of the potential on the substrate is less than the target voltage. Otherwise, a net positive charge is transferred into the substrate. In this manner, the absolute value of the potential on the substrate is driven towards the target voltage.

7 Claims, 6 Drawing Figures

TWO-WAY REGULATED SUBSTRATE BIAS GENERATOR

BACKGROUND OF THE INVENTION

The invention relates to the field of metal-oxide-semiconductor memory devices and, more particularly, to an improved negative substrate bias generator for dynamic random access memories.

A negative bias voltage is typically applied by a back bias generator to the substrate of a metal-oxide-semiconductor (MOS) random access memory (RAM) to improve the overall performance of the MOS circuit. More specifically, the junction capacitance between the P-doped silicon substrate and adjacent N+ doped silicon layers is lowered when a negative voltage is applied to the substrate. Accordingly, the MOS circuitry operates at a faster speed. Also, a negatively biased substrate reduces the sensitivity of on-chip threshold voltages to variations in the potential between the source of an MOS transistor and the substrate bias. Recently, the back bias voltages have been generated on the chips themselves by using charge pump circuitry.

In order to achieve high performance in a 5 volt only RAM design, it is desirable to use enhancement mode MOS devices having a threshold voltage range of 150 to 650 millivolts with a back bias voltage between −2 to −3 volts. Also, it is desirable to construct a substrate bias pump which is capable of driving the potential on the substrate upwardly or downwardly to a desirable level. However, the preference for a low threshold range creates a few problems with the design of a substrate bias pump circuit. During the power-up of the pump, the substrate may have a positive potential ranging from 0 to 300 millivolts. As a result, enhancement mode MOS devices will have threshold voltages as low as several hundred millivolts negative. Accordingly, devices which are enhancement mode for normal circuit operation may operate in the depletion mode during power-up.

The pump oscillator and pump circuit must be able to start up and push the substrate negative in order for the transistors of the circuit to achieve the proper threshold voltage levels and operate as enhancement mode MOS devices. However, the pump oscillator must start in the absence of a substrate bias with its MOS devices, which are intended to be enhancement mode, operating in the depletion mode. In addition, assuming a proper start-up, there are several transistors in the output portion of the conventional pump which operate with their sources having a potential near the substrate voltage. These devices have a 0 volt back gate bias and may operate as depletion mode MOS transistors.

Another problem with previous charge pump circuitry is that the MOS devices used for coupling the driving signals to the pump have parasitic source and drain capacitances which impair the device coupling efficiency. As a result, the effectiveness of the pump is reduced. Also, diffusions or parasitic diodes from the MOS device which is connected to the substrate may cause electrons to be injected into the substrate. This is detrimental to the storage mechanism of the dynamic RAM.

OBJECTS OF THE INVENTION

A general object of the invention is to provide an improved substrate bias generator for an MOS integrated circuit.

A more specific object of the invention is to provide an on-chip back bias generator with enhancement mode MOS devices having a low threshold range so as to attain faster circuit speed and minimize threshold voltage variations in the memory chip.

Another object of the invention is to provide a pump oscillator in the substrate bias generator which will initiate and maintain operation at a low power supply voltage.

A further object of the invention is to provide a pump circuit which properly functions even if the pump circuit transistors are operating as depletion mode transistors while the power supply voltage powers up.

BRIEF DESCRIPTION OF THE DRAWING

The above objects and further objects of the invention will be realized more particularly from the detailed description of the preferred embodiment and from the accompanying drawing, of which.

DETAILED DESCRIPTION OF THE INVENTION

Figure 1:
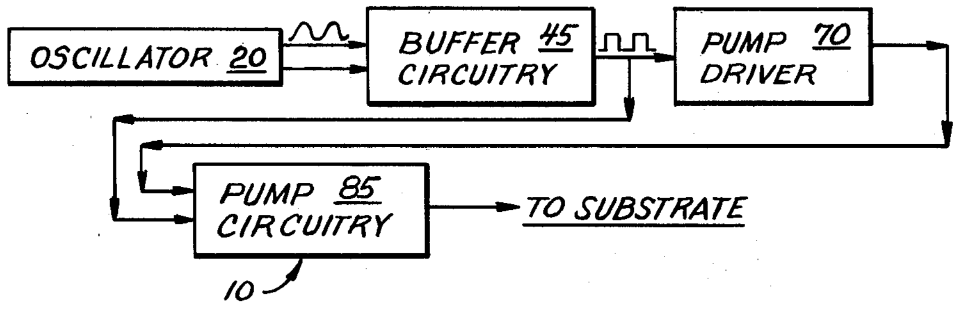
FIG. 1 illustrates a block diagram of the substrate bias generator in which the invention is embodied.

Referring to FIG. 1, the numeral 10 designates generally a substrate bias generator arrangement including an oscillator 20, buffer circuitry 45, a pump driver 70, and a substrate pump 85. Preferred embodiments for each of these elements are disclosed in FIGS. 2–4. The oscillator 20 properly operates at a low power supply voltage to generate a signal which is applied to the buffer circuitry 45. The buffer circuitry 45 generates a signal with sharper amplitude transitions for application to the pump driver 70 and the pump circuitry 85. The pump driver 70 generates a signal which is slightly delayed but in approximate opposite phase to the signal generated by the buffer circuitry 45. The two signals from the buffer circuitry 45 and pump driver 70 enable the pump circuitry 85 to transfer net charge into and out of the substrate, depending upon a target voltage to be discussed below.

Figure 2:
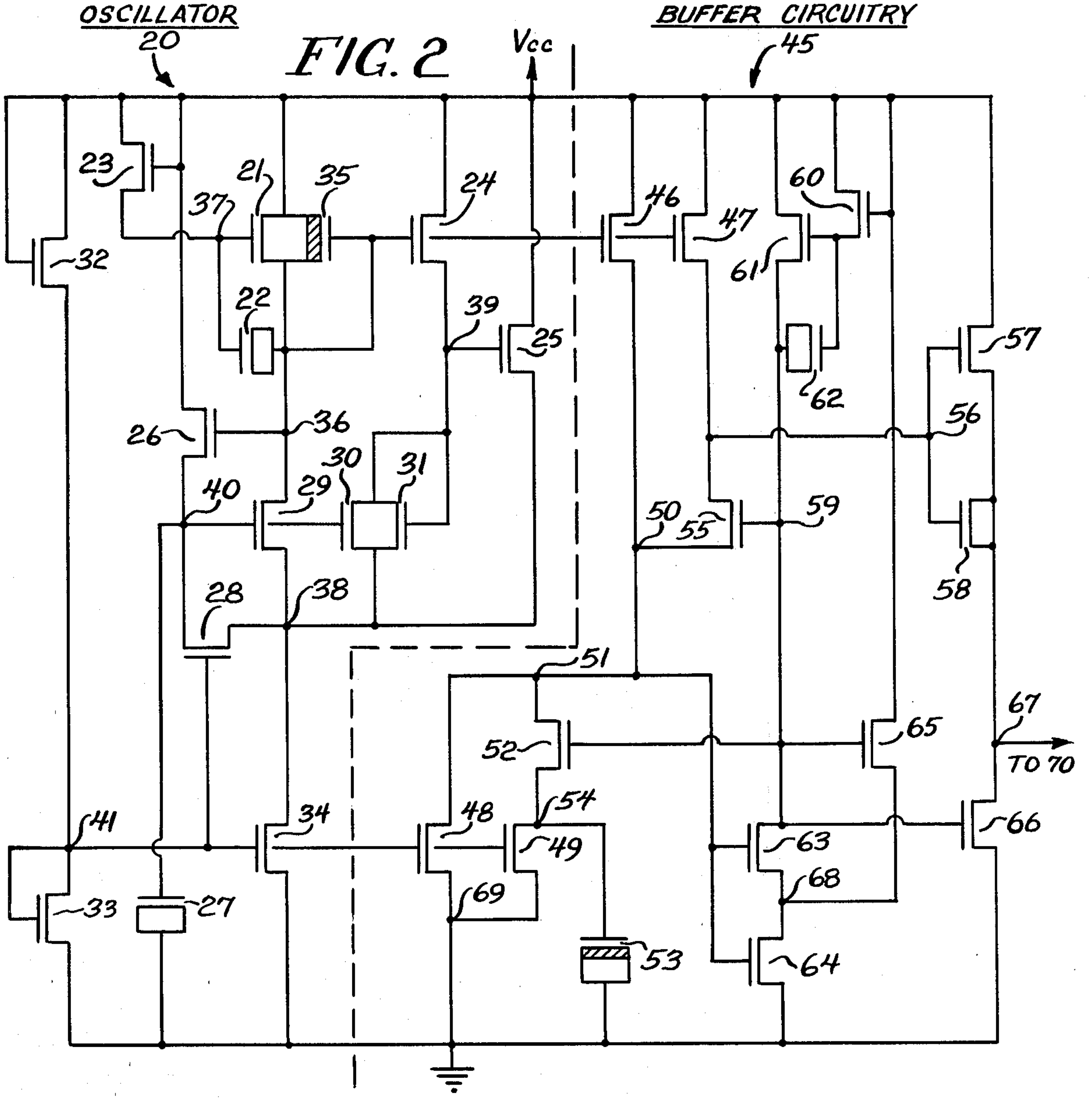
FIG. 2 illustrates a preferred embodiment for the pump oscillator and the buffer circuit of FIG. 1.

The oscillator 20 and the buffer circuitry 45 are shown in FIG. 2. The oscillator 20 is an improvement on a basic Schmitt trigger oscillator and is arranged from enhancement mode metal-oxide-semiconductor (MOS) devices 21–34 and depletion mode MOS device 35 to generate an output signal on node 36 for application to the mate circuitry 45. Node 36 is coupled via MOS devices 21 and 35 to a 5 volt power source $V_{cc}$. The source and drain of the MOS device 21 are tied to the corresponding source and drain of the MOS device 35. The node 36 is capacitively coupled to node 37 via the MOS device 22. The node 37 drives the gate of the MOS device 21 and is connected to the source of the MOS device 23. The voltage on node 37 is clamped a threshold volt below $V_{cc}$ because the drain and gate of the MOS device 23 are connected to $V_{cc}$.

A signal is generated on node 36 from node 36's positive and negative feedback paths. The positive feedback path is defined by MOS devices 24 and 25 and node 38. The signal on node 36 drives the gate of the MOS device 24. The drain of the MOS device 24 is connected to $V_{cc}$ while its source is coupled to node 39. Accordingly, the voltage on node 39 is a threshold volt below the voltage on node 36. The voltage on node 39 drives the gate of the MOS device 25 so that the voltage applied to node 38 from the source of the MOS device 25 is one threshold volt below the voltage on node 39.

The negative feedback path is defined by the MOS device 26 and node 40. The voltage on node 36 drives the gate of the MOS device 26. The drain of the MOS device 26 is connected to $V_{cc}$ while the source of the same device is coupled to node 40. The MOS device 27 is connected between the node 40 and ground with its gate connected to node 40 and its drain and source tied to ground so as to operate as a capacitor. The node 40 is connected to one terminal of the discharge MOS device 28, while the node 38 is connected to the other terminal of the same MOS device. The voltage on node 40 drives the gates of the MOS devices 29 and 30. The MOS devices 30 and 31 are tied together at their source and drain terminals and coupled to the node 39 to prevent the MOS device 25 from self-bootstrapping as discussed below.

The MOS device 34 is coupled between node 38 and ground. Its gate is driven by a reference voltage at node 41 created by enhancement mode MOS devices 32 and 33 which are arranged as a voltage divider between $V_{cc}$ and ground. As a result, the required power level of the oscillator 20 is reduced. The reference voltage is set at approximately one-half $V_{cc}$ so that the MOS device 21 operates in saturation over most of the cycle. This voltage is appled via node 41 to the gates of MOS devices 28 and 34 as well as to the buffer circuitry 45.

At an arbitrary time during operation, the MOS devices 34 and 28 are on. At this time, the voltages on nodes 36 and 38 are low while the voltage on node 40 is high. The voltage on node 37 is one threshold volt below $V_{cc}$, being clamped by the MOS device 29. Accordingly, the voltage on node 36 remains low. However, the voltage on node 40 is slowly falling due to the current path provided by the MOS device 28. When the falling voltage on node 40 approaches one threshold voltage above node 38, device 29 begins to turn off. This enables the voltage on node 36 to rise. Once the voltage on node 36 rises two threshold volts above ground, the MOS devices 24 and 25 are both turned on. As a result, the voltage on node 38 rises, turning device 29 completely off. Thereafter, the voltage on node 36 rises rapidly turning on the MOS devices 24 and 25 harder. Also, the voltage on node 40 is falling because of the discharge path provided by the MOS device 28 from node 40 to node 38. Capacitive coupling of node 37 to node 36 via the MOS device 22 raises the potential of node 37 to less than a threshold volt from $V_{cc}$. The MOS device 23 turns off and unclamps the voltage on node 37. As a result, the voltage on node 37 rises above $V_{cc}$, thereby pulling the voltage on node 36 all the way up to $V_{cc}$.

During the above-mentioned activity, the voltage on node 40 falls past a low trip point voltage. When this occurs, the voltage rise on node 36 turns on the MOS device 26 causing the MOS device 27 to charge up through node 40. The MOS device 29 turns on when the voltage on node 40 is more than a threshold volt above the increased voltage on node 38. As the MOS device 29 turns on, it pulls down the voltage on node 36. As a result, the MOS devices 24 and 25 begin to turn off, and the voltage on node 38 drops turning device 29 on harder and pulling the voltage on node 36 down further. This turns off the MOS device 26 and stops the charging of the MOS device 27. Also, this completes the turn off of devices 24 and 25. Consequently, the voltage on nodes 36 and 38 continue to fall. The voltage on node 37 falls because it is capacitively coupled via the MOS device 22 to the voltage on node 36. Accordingly, the MOS device 23 turns on and again clamps the voltage on node 37 to one threshold volt below $V_{cc}$. Meanwhile, the voltage on node 40 has reached the high trip point voltage. As the voltage on node 38 falls, it will reach a level of one threshold volt below the reference voltage at node 41 and at the gate of device 28. As a result, device 28 turns on creating a discharge path for node 40 to node 38, thereby causing the voltage on node 40 to fall. The above-described cycle is then repeated. In this manner, the voltage on node 40 never has a stable operating point.

Enhancement mode MOS devices 30 and 31 are included in the circuit to prevent the MOS device 25 from self-bootstrapping. Accordingly, as node 38 is pulled up by devices 24 and 25, it remains more than two threshold voltages below node 36. Bootstrapping would cause the high trip point of node 40 to move up and be unreachable. The MOS device 30 also increases the speed of the positive feedback path at the high trip point of node 40.

The output signal generated on node 36 oscillates slowly between a high level ($V_{cc}$) and a low level which is several hundred millivolts above ground. However, the input signal to the pump driver 70 (see FIG. 3) requires amplitude transitions which are sharper than that generated by the oscillator 20. Accordingly, the signal on node 36 is first applied to buffer circuitry 45 before the application to the pump driver 70.

Referring more specifically to the details of buffer circuitry 45, as shown in FIG. 1, the signal on node 36 is coupled to the gates of enhancement mode MOS devices 46 and 47 while the reference voltage on node 41 is coupled to the gates of enhancement mode MOS devices 48 and 49. The signal on node 36 being coupled to the gate of the MOS device 46 is transferred as a source follower signal to a node 50. However, the signal transferred to node 50 is one threshold volt lower than the signal on node 36. The signal on node 50 is pulled lower by enhancement mode MOS devices 48, 49, and 52 and a depletion mode MOS device 53. The MOS devices 48 and 52 are connected together at node 51 while MOS devices 49, 52, and 53 are coupled together at node 54. The MOS device 49 is also coupled to the MOS device 48 at node 69 which, in turn, is connected to ground. The MOS device 53 capacitively couples the node 54 to ground.

The signal generated on node 50 is coupled to enhancement mode MOS device 55 which combines with the MOS device 47 to form a push-pull driver. This push-pull driver generates a signal on node 56 which is applied to the gates of enhancement mode MOS devices 57 and 58. The bgate of the MOS device 55 is coupled to node 59. A classic bootstrapped Schmitt trigger defined by enhancement mode MOS devices 60–65 generates a signal on node 59 which drives the gates of the MOS device 55. This Schmitt trigger is designed to have a small amount of hysterisis, but a low trip level which is well above ground. The signal generated on node 59 also drives the gates of the MOS device 52 and enhancement mode MOS device 66. The latter MOS device combines with the MOS devices 57 and 58 to form a push-pull driver generating an output signal from the buffer circuit 45 on node 67.

When the voltage on node 36 is high, at approximately $V_{cc}$, the voltage on node 50 is one threshold volt lower. Accordingly, the MOS devices 63 and 64 are turned on while the MOS device 65 is turned off. Also, the MOS device 61 is turned on with the voltage on its gate being one threshold volt below $V_{cc}$. As a result, the voltage on node 59 is near ground. Accordingly, the MOS device 52 is turned off and the voltage on node 54 is at a low level. With the signal on node 59 being near ground, the MOS device 66 is turned off. Meanwhile, the signal on node 67 has risen to $V_{cc}$. This positive voltage rise was capacitively coupled via the MOS device 58 to node 56. Accordingly, the signal on node 56 has been pushed up to the 7 volt level in this preferred embodiment.

When the signal on node 36 in oscillator 20 starts to go low, the signal on node 50 goes low too, being held one threshold volt below the signal on node 36 by the MOS device 46. As the low trip point of the Schmitt trigger in the buffer circuitry 45 is approached, the MOS devices 63 and 64 start to turn off, and the signal on node 59 begins to rise. When the signal on node 59 reaches on threshold volt, the MOS device 52 turns on. In turn, the MOS device 53 begins to charge. There is a low impedance from the source of the MOS device 52 to ground through the gate capacitance of the MOS device 53. The signal on node 50 is pulled down further by the current path created through the MOS device 49 and the charging of the MOS device 53. A positive feedback path which enforces switching is generated by the MOS device 52 being turned on. This path is generated before the Schmitt path through the MOS device 65 is activated. The MOS device 66 also turns on and acts to pull down on the signal at node 67, which is held high by the MOS device 57 with a bootstrapped level on the latter MOS device's gate.

As the signal on node 59 continues to rise, the MOS device 65 is activated. This, in turn, drives the signal on node 68 high, turning off the MOS device 63. The rise in the signal on node 59 is capacitively coupled via the MOS device 62 to the gate of the MOS device 61. As a result, the gate of the MOS device 61 is bootstrapped to 7 volts through the MOS device 62 and the signal on node 59 is pulled all the way up to $V_{cc}$. As node 59 rises, the MOS device 55 turns on, causing more current to flow into the node 50. However, because the pull down activity of the MOS device 52 on node 50 has been increased by the current path through the MOS device 49, the MOS device 55 pulls the signal on node 56 down, thereby turning off the MOS device 57. As a result, the signal on node 67 falls to ground.

The MOS device 47 has remained off during the negative potential transition on node 36. However, when the signal on node 36 begins to rise again, the signals on nodes 50 and 56 are pulled up again. As the signal on node 50 reaches the high trip point, the signal on node 59 falls and the MOS devices 52 and 55 are turned off. The signal on node 59 continues to fall and approaches ground whereupon the MOS device 66 is turned off. Accordingly, the signal on node 67 rises as the MOS device 57 is again turned on by the rising signal on node 56. As node 67 rises, the MOS device 58 pushes up the signal on node 56 and turns off the MOS device 47. This allows the signal on node 56 to rise to 7 volts, thereby pulling the signal on node 67 to $V_{cc}$.

Figure 3:
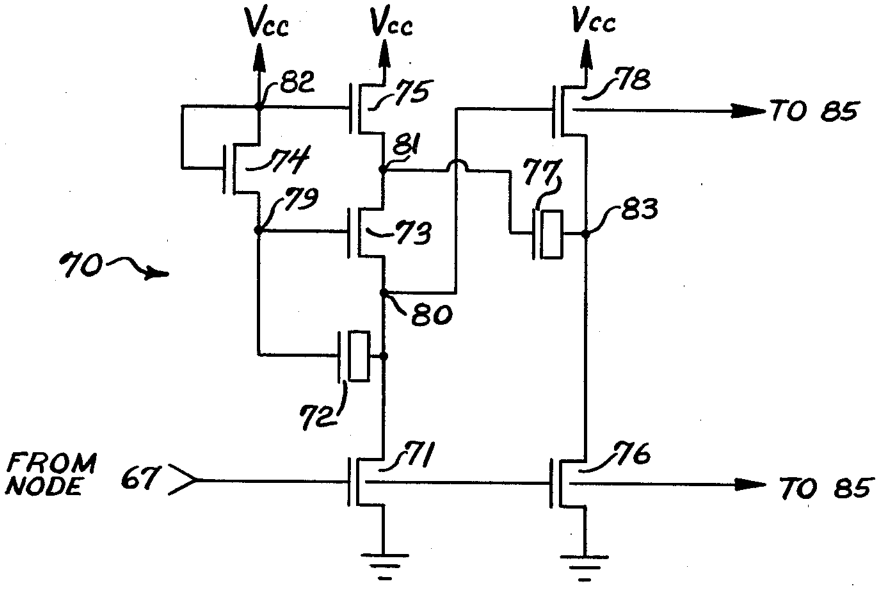
FIG. 3 illustrates a preferred embodiment of the pump driver of FIG. 1.

The sharper transitioning signal on node 67 is applied to the pump driver 70 as shown in FIG. 3. The pump driver 70 is arranged as a double bootstrap inverter. The input signal from node 67 causes the output signal of the pump driver 70 to oscillate between $V_{cc}$ and ground.

The double bootstrap inverter includes a first inverted formed by enhancement mode MOS devices 71–75 and a second inverter formed by enhancement mode MOS devices 76–78. Referring to the first inverter, the gate of the MOS device 71 is driven by the signal from node 67 while the same device's drain is coupled to node 80. A node 79 is capacitively coupled to node 80 by MOS device 72. Node 79 also drives the gate of the device 73. The MOS device 73 is coupled between node 80 and a node 81. The gate and one terminal of the MOS device 74 are tied together at node 82 which is connected to $V_{cc}$. $V_{cc}$ is also applied to the gate of the MOS device 75 whose gate and drain are coupled between $V_{cc}$ and the node 81.

The gate of the MOS device 76 in the second inverter of pump driver 70 also receives the signal from node 67. The drain of the MOS device 76 is connected to node 83. The node 83 is capacitively coupled via the MOS device 77 to the node 81 and coupled to the MOS device 78. The gate of the MOS device 78 is driven by the signal generated on node 80.

At an arbitrary time when the signal on node 67 is at $V_{cc}$, the MOS devices 71 and 76 are turned on, and the signals on nodes 80 and 83 are low. Both MOS devices 74 and 75 are on. As a result, the voltages on nodes 79 and 81 are clamped by MOS devices 74 and 75, respectively, to one threshold volt below $V_{cc}$. Also, the MOS device 73 is turned on. Since the MOS devices 71, 72, 73, and 75 are all turned on, there is a current path from $V_{cc}$ to ground. Accordingly, the MOS device 77 is turned on with a charged gate to channel capacitance.

When the signal on node 67 goes low, the MOS devices 71 and 76 turn off. As a result, the signal on nodes 80 begins to rise via the current path through the MOS devices 75 and 73. As the signal on node 80 rises, the signal on node 79 is bootstrapped high by the MOS device 72. Accordingly, the MOS device 74 is turned off when the signal on node 79 rises to within one threshold volt of $V_{cc}$. The unclamped signal on node 79 continues to rise above $V_{cc}$ to 9.5 volts. The current from the MOS device 75 also slightly pulls up the signal on node 81.

As the signal on node 80 continues to rise, the MOS device 78 turns on, and the positive voltage transition is coupled to the node 83 and, via the capacitance of MOS device 77, to the node 81. Accordingly, the signal on node 81 rises to turn off the MOS device 75, thereby allowing the unclamped signal on node 81 to be pushed above $V_{cc}$ to 7 volts.

During the period in which the signal on node 81 is capacitively coupled to the positive voltage transition created by the MOS device 78, the MOS device 73 remains turned on due to the bootstrapping of the signal on node 79 via the MOS devices 73 and 72. Thus, the signal on node 80 follows the rise of the signal on node 81 above $V_{cc}$ to 7 volts, pulling the voltage on node 83 to $V_{cc}$.

When the signal on node 67 goes high to $V_{cc}$, the MOS devices 71 and 76 again turn on and pull the signal on node 80 and the signal applied to the MOS device 77, respectively, low. As a result, the signal on node 79 is capacitively coupled low via the MOS device 72 and is clamped by the MOS device 74 which turns on once the signal on node 79 falls one threshold volt below $V_{cc}$. The MOS device 73 then further drives the signal on node 81 low, and this signal is clamped by the MOS device 75 which also turns on once the signal on node 81 falls one threshold volt below $V_{cc}$. The falling of the signal on node 80 turns off the MOS device 78 when the voltage difference between the signals on nodes 80 and 83 is less than one threshold volt. With the signal on node 81 being clamped by the MOS device 75 and the signal on node 83 going low, the gate capacitance of the MOS device 77 is recharged.

Figure 5:
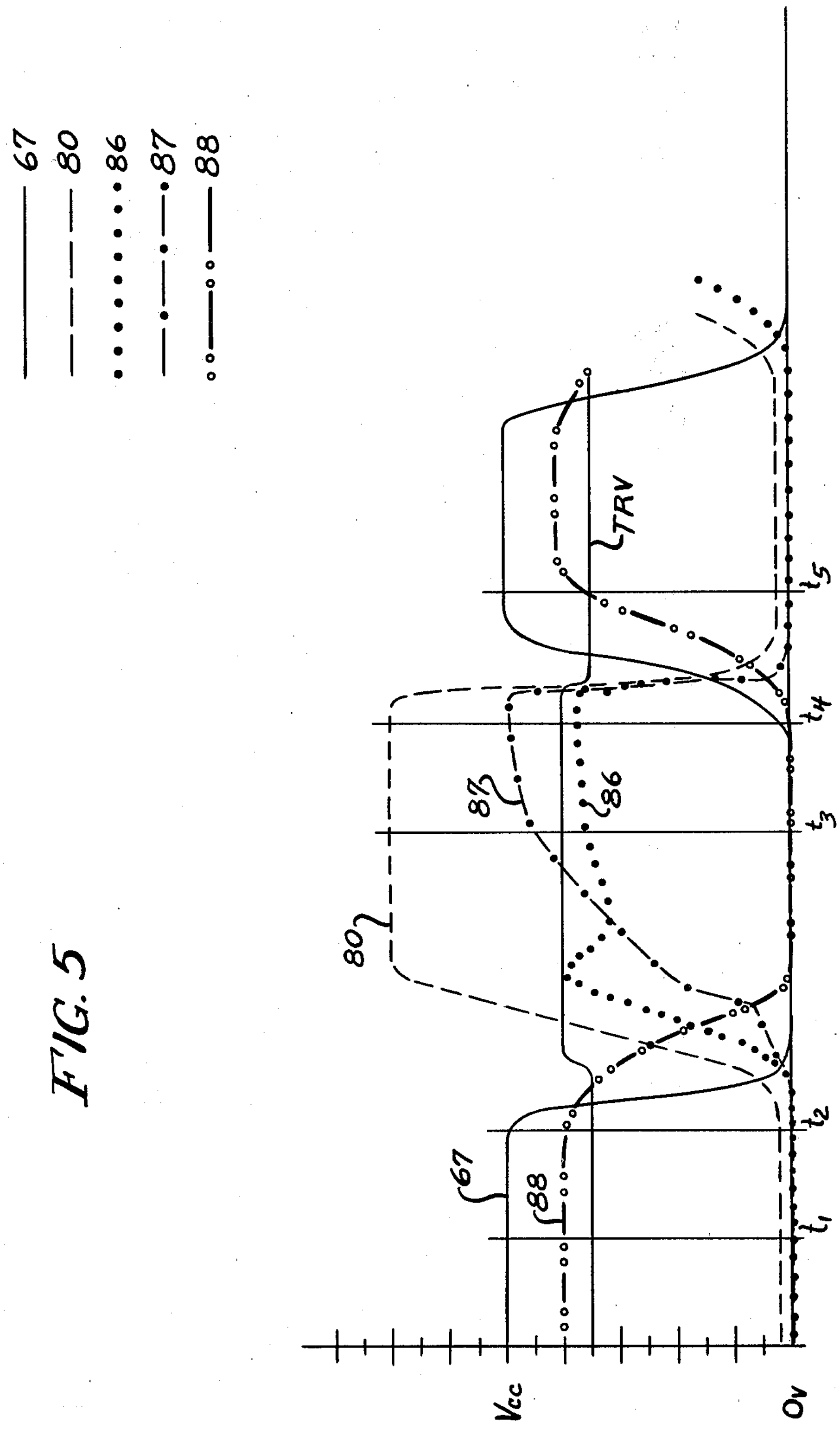
FIGS. 5 and 6 illustrates various waveforms to facilitate the description of the operation of the substrate bias pump generator.

The signals on node 67 and 80 are applied as periodic pulse trains to the substrate pump 85. The pulse train on node 67 falls from $V_{cc}$ to ground while the pulse train on node 80 reacts and rises from near ground to 7 volts (2 volts above $V_{cc}$), as shown in FIG. 5. Accordingly, the pulses on nodes 67 and 80 are in approximate opposite phase with the pulse on node 80 being slightly delayed.

Figure 4:
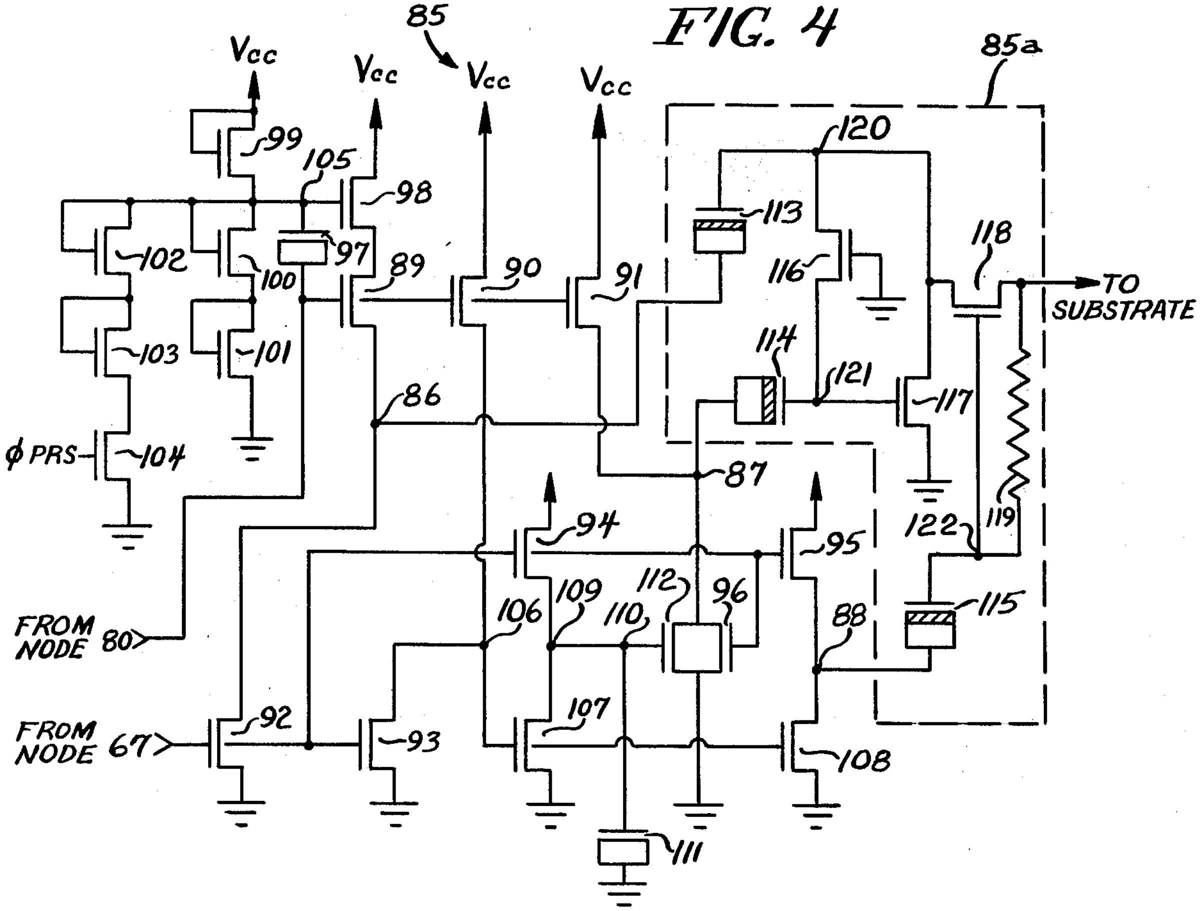
FIG. 4 illustrates a preferred embodiment of the negative substrate pump of FIG. 1.

Referring to FIG. 4, the substrate pump is shown. It includes a number of push-pull drivers which are coupled to the clock pulse signals on nodes 80 and 67 and which generate three trains of periodic pulses at nodes 86, 87, and 88 for application to the pump output stage 85*a*.

The signal from node 80 is applied to the gates of enhancement mode MOS device 89–91, while the signal from node 67 is applied to the gates of enhancement mode MOS devices 92–96. The MOS devices 89 and 92 are coupled together as a driver to generate a first train of periodic pulses on node 86 for application to the pump stage 85*a*.

The magnitude of the signal on node 86 is limited by a target reference voltage developed by enhancement mode MOS devices 97–104. More particularly, the MOS devices 100–104 form a pair of voltage dividers in parallel which combine with the MOS devices 97 and 99 for applying two levels of potential to the gate of the MOS device 98. The MOS device 97 capacitively couples the signal from node 80 to node 105.

The gate of the MOS device 104 is driven by a precharge clock signal $\phi_{PRS}$. When the clock signal $\phi_{PRS}$ is high during precharge, the target reference voltage TRV applied to the gate of the MOS device 98 via node 105 is approximately 3.5 volts (see FIG. 5). When the clock signal $\phi_{PRS}$ goes low at the beginning of the active cycle, the MOS device 104 turns off and the target reference voltage TRV applied to the gate of MOS device 98 rises to about 4 volts. The MOS device 98 functions as an output source follower of the target reference voltage on the gate of MOS device 98, minus one threshold volt. The voltage on the source of MOS device 98 is applied to node 86 via the MOS device 89. The voltage on node 86 is transferred into the substrate, as discussed below.

The MOS devices 90 and 93 form a push-pull driver by being coupled together at node 106 to generate a signal for application to the gates of transistors 107 and 108. In turn, the MOS device 107 is coupled to the MOS device 94 at node 109 to form another push-pull driver generating a signal for application to node 110. Node 110 is capacitively coupled to ground via the gate of enhancement mode MOS device 111. The signal generated on node 110 drives the gate of enhancement mode MOS device 112. The terminals of MOS devices 112 and 96 are tied together, one side being coupled to ground and the other side being coupled to the MOS device 91 at node 87 to generate a second train of periodic pulses. The third train of periodic pulses is generated by the MOS devices 95 and 108 which are coupled at node 88 to form another push-pull driver. The signal on node 88 is phase opposite to the signal on node 86.

At an arbitrary time $t_1$ (see FIG. 5) when the signal on node 67 is high and the signal on node 80 is low, the MOS devices 92–96 turn on and the MOS devices 89–91 turn off. The combination of MOS device 89 being off and MOS device 92 being on causes the signal on node 86 to be low. Similarly, the MOS device 90 is off and the MOS device 93 is on, causing the signal on node 106 to be low. The low signal on node 106 turns the MOS device 107 off while the high signal on node 67 has already turned the MOS device 94 on. Accordingly, the signal on node 109 is one threshold volt below $V_{cc}$. This, in turn, activates the MOS device 112. Because the MOS device 96 is also turned on and the MOS device 91 is turned off, the signal on node 87 is low. Finally, the MOS device 108 is turned off because the signal on node 106 is low, and the MOS device 95 is turned on by the high signal from node 67. Accordingly, the signal on node 88 is one threshold volt below $V_{cc}$.

When the signal from node 67 goes low, at time $t_2$, the MOS devices 92–96 turn off. A short interval thereafter, the signal on node 80 goes high. As before, the signal on node 80 is slightly delayed because it is derived from the signal on node 67. The signal on node 80 goes to 7 volts, whereas the signal on node 67 only goes to $V_{cc}$ when it is high. The high signal on node 80 turns on to the MOS devices 89–91. The signal on node 86 rises as the MOS device 89 turns on to a voltage limited by the target reference voltage whose output source follower MOS device 98 is connected to the drain of the MOS device 89. With the signal on node 80 rising, the MOS device 97 capacitively couples charge via node 105 to the gate of the MOS device 98 and compensates for the negative coupling from the source to gate of the MOS device 98.

The positive voltage transition on node 86 transfers charge into the pump stage 85*a* representing a negative voltage to which the substrate is driven. As mentioned before, the MOS device 104 is driven by the precharge clock signal $\phi_{PRS}$ to modify the target voltage, this target voltage being utilized for active and precharged periods. During an active cycle, the MOS device 104 is turned off, thereby allowing a higher target voltage. Thus, the pump stage 85*a* may generate a more negative voltage during an active period than during a precharge period when the MOS device 104 is turned on.

As noted above, the rise in the signal on node 80 also turns on the MOS device 90, causing the signal on node 106 to rise to $V_{cc}$. As a result, the MOS devices 107 and 108 are turned on. Activating the MOS device 107 causes the signal on node 110 to be slowly driven to a low state in that the MOS device 107 is a high impedance device which must discharge the capacitance of the MOS device 111 in order to drive the signal on node 110 to ground.

The high signal on node 90 also turns on the MOS device 91. However, the activated MOS device 91 will not cause the signal on node 87 to rise more than a few hundred millivolts because the lower impedance transistor 112 is still clamping the node 87 toward ground.

After the signal on node 110 goes low, the MOS device 112 turns off, thereby unclamping the signal on node 87 and allowing that signal to rise to $V_{cc}$. Thus, there is a delay between the signal on node 86 rising and the signal on node 87 rising. At time $t_3$, the signals on nodes 86 and 87 are high, while the signal on node 88 is low.

After a half cycle of the oscillator, the signal on node 67 again goes high to $V_{cc}$ at time $t_4$, and the MOS devices 92–96 turn on. Shortly thereafter, the signal on node 80 drops from 7 volts to near ground, and the MOS devices 89–91 turn off. As a result, the signals on nodes 86, 106, and 87 go low. However, there is no delay in the signal on node 87 going low. When the signal on node 106 goes low, the MOS device 108 turns off. Therefore, the signal on node 88 is pulled high to within one threshold volt of $V_{cc}$ by the activated MOS device 95. When the signal on node 67 went high, the MOS device 94 was turned on. Because the signal on node 106 is now low, the MOS device 94 pulls the signal on node 110 high to within one threshold volt of $V_{cc}$, thereby recharging the capacitance of the MOS device 111 and turning on the MOS device 112. Activating the MOS device 112 has no effect because the MOS device 96 is already turned on. Accordingly, there is no delay for the signal on node 87 going low. Thus, at time $t_5$, the signals on nodes 86 and 87 are low, while the signal on node 88 is high.

The signals on nodes 86–88 are applied to the pump output stage 85*a* of the substrate bias pump. The pump output stage 85*a* is defined by depletion mode MOS devices 113–115 which function as capacitors, enhancement mode MOS devices 116–118, and resistor 119. The pump output stage 85*a* initially transfers charge into the substrate to raise the substrate voltage. Thereafter, the pump output stage 85*a* transfers charge out of the substrate to reduce to the substrate voltage. The net effect of these charge transfers is to drive the absolute value of the substrate voltage towards the target voltage. This will be further discussed below.

Node 120 is capacitively coupled via the MOS device 113 to the signal on node 86 so as to receive positive and negative voltage transitions. Similarly, node 121 is capacitively coupled via the MOS device 114 to the signal on node 87 so as to receive positive and negative voltage transitions. Also, node 122 is capacitively coupled via the MOS device 115 to the signal on node 88 so as to receive positive and negative voltage transitions. As described below, the potential transitions on nodes 120–122 are employed to develop a two target negatively biased voltage on the substrate.

The MOS device 116 is connected between nodes 120 and 121 with its gate biased to ground for coupling the potential on node 121 towards the potential on node 120. Coupling occurs only when the potentials on both nodes are negative and the potential on node 120 is at least a threshold volt below the potential of the grounded gate of the MOS device 116.

The MOS device 117 is connected between node 120 and ground. Node 121 is coupled to the gate of the MOS device 117 for clamping the signal on node 120 to ground when the signal on node 87 is high.

The MOS device 118 is connected between the node 120 and the substrate (not shown) for activation whenever the potential of node 122 is more than one threshold volt above the potential on the substrate. The gate of the MOS device 118 is coupled to node 122. In addition, a resistor 119 is connected between node 122 and the substrate.

Figure 6:
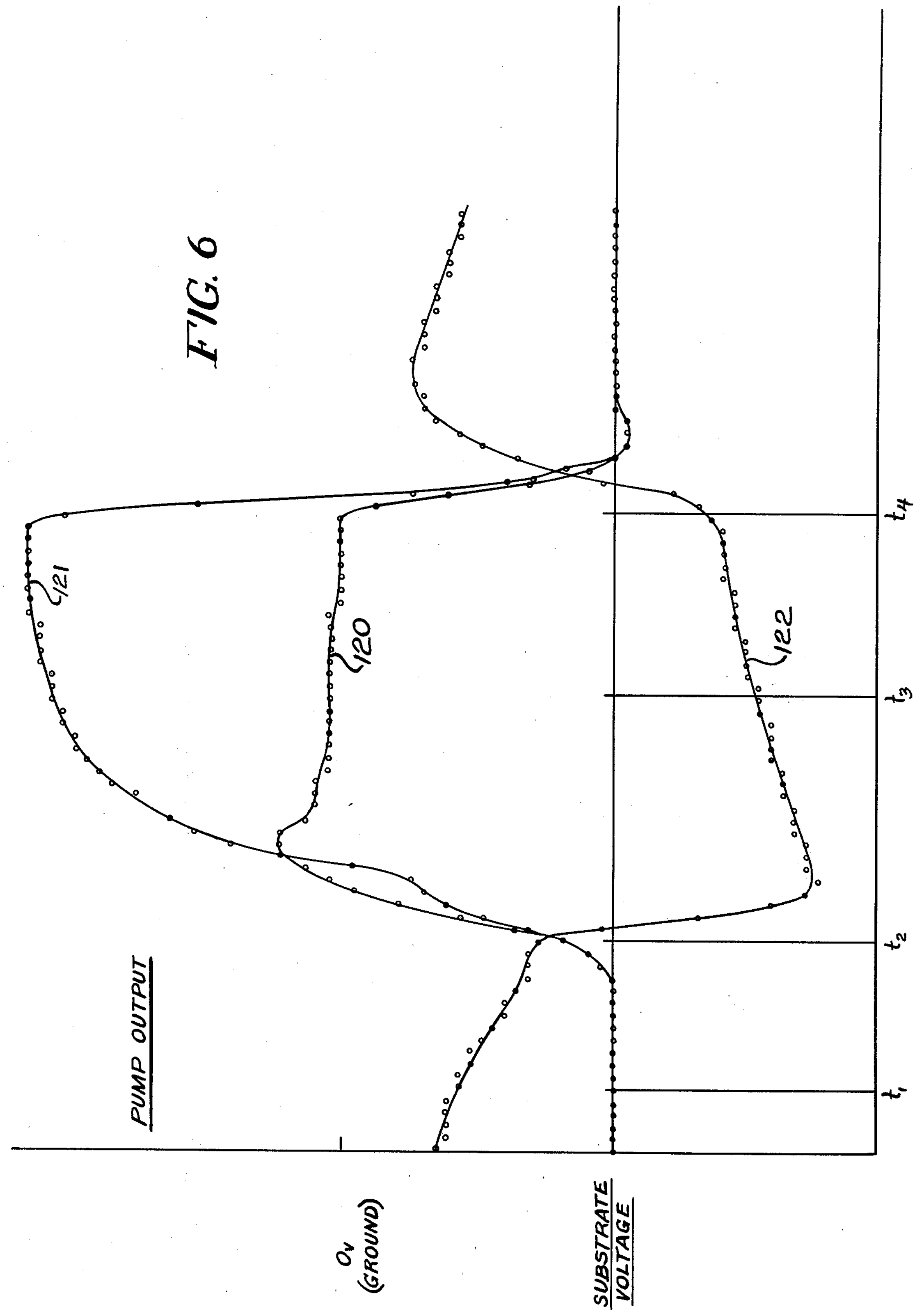

Assume the condition of time $t_1$ (see FIGS. 5 and 6) when the signals on nodes 86 and 87 are low and the signal on node 88 is high. The signal on node 122 is somewhat higher than the substrate potential, slowly leaking to the substrate potential through resistor 119 with a time constant longer than the oscillator. The MOS devices 116 and 118 are on so that the signals on nodes 120 and 121 are clamped to the substrate potential. As a result, the MOS device 117 is off.

When the signal on node 86 goes high and the signal on node 88 goes low at time $t_2$, the following occurs. The negative voltage transition on node 88 is capacitively coupled via the MOS device 115 to node 122, thereby swinging the voltage on node 122 below the substrate potential and turning off the MOS device 118. The positive voltage transition on node 86 is capacitively coupled via the MOS device 113 to node 120, thereby pushing the signal on node 120 above ground. Since there is a time delay before the signal on node 87 goes high, the MOS device 116 is still on and node 121 is coupled via the MOS device 116 to the positive voltage rise of the signal on node 120. When the signal on node 121 rises to within one threshold volt of ground, the MOS device 116 turns off. The delayed positive voltage rise of the signal on node 87 then drives the signal on node 121 further positive. The MOS device 117 turns on when the signal on node 121 rises more than one threshold volt above ground. When this occurs, the signal on node 120 is clamped to ground. Meanwhile, the signal on node 122 is leaking towards the substrate potential through resistor 119. The signal on node 86 raises to a control voltage offset above ground as set by the target reference voltage.

At the beginning of the next half cycle when the signal on node 67 goes high at time $t_4$, the MOS device 92 turns on and begins pulling the signal on node 86 toward ground. The signal on node 120 is capacitively coupled via the MOS device 113 to be pulled low. The signal on node 67 also turns on the MOS device 96, thereby pulling the signal on node 87 low. The signal on node 121 is capacitively coupled via the MOS device 114 to node 87, causing node 121 to be pulled low. The signal on node 88 is pushed high because the signal on node 67 turned on the MOS device 95. Accordingly, the signal on node 122 is capacitively coupled via the MOS device 115 above the potential on the substrate, thereby turning on the MOS device 118. Because the signal on node 121 has gone low, the MOS device 117 turns off. The MOS device 92 is sized much smaller than the MOS device 118. Therefore, the signal on node 120 is pulled negative by the MOS device 118 transferring a quantity Q1 of charge into the substrate at the same time the signal on node 86 is being pulled low by the MOS device 92.

If the absolute value of the substrate potential is greater than the target voltage, the MOS device 118 pulls the signal on node 120 close to ground. Then the MOS device 92 pulls the signal on node 86 to ground potential. As a result, a quantity of charge Q2 is transferred from the substrate via the MOS devices 118 and 113 which is smaller than the quantity Q1 transferred into the substrate previously. As a result, a net charge transferred into the substrate raises the substrate voltage.

If the absolute value of the potential on the substrate is less than the target voltage, the signal on node 86 will not be pulled all the way to ground by the MOS device 118, but will be left at a higher voltage. Accordingly, with the MOS device 92 being on, the signal on node 86 is pulled to ground, transferring charge Q2 out of the substrate via the MOS devices 113 and 118. The charge Q2 removed will be greater than the charge Q1 initially transferred into the substrate so that the net charge transferred out of the substrate reduces the substrate voltage. This transferring process stops when the signal on node 86 reaches ground or the next half cycle begins, whichever occurs first.

With the voltage on node 86 being at ground and the voltage on node 120 being equal to the potential on the substrate, the charge on the MOS device 113 differs from what it would have been if the substrate had been at the target potential. Therefore, the net change in charge on the substrate is reflected by a corresponding change in the charge on the MOS device 113.

In the next half cycle, the activity of the pump is identical to that described above except that when the charge on the MOS device 113 reestablishes itself to a full level, the net change in the charge on the MOS device 113 is transferred to ground via MOS device 117. The net quantity of charge transferred from the substrate to ground in one cycle period is an average current flow of the net charge per time period. This current drives the substrate toward (up or down) the target potential as determined by the target reference voltage.

The orientation of MOS devices 113–115 with their gates on the right side of the coupling structure removes parasitic source and drain to substrate capacitance from the nodes on the right side of the MOS devices and places the capacitance on the left side of the same structures. As a result, the efficiency of these coupling structures is improved because the parasitic capacitance is not in parallel with the driven load.

The aforementioned substrate bias generator is an advantageous improvement in that the pump stage contains no diffusions or diodes which are forward biased to the substrate and thus cannot inject electrons into the substrate. The gating on and off of the MOS device 118 serves to provide a positive turn off of the MOS device 118 if the device starts to operate as a depletion mode transistor. This prevents leakage through the MOS device 118 to the substrate when the signal on node 120 is clamped to ground. When the MOS device 118 turns on during the period in which the signals on nodes 120 and 121 are at or below the potential on the substrate, the threshold voltage drop in the MOS device 118 is eliminated. As a result, the signal on nodes 120 and 121 are inhibited from going sufficiently negative for the parasitic diodes to inject electrons into the substrate.

The positive swing on node 121 which clamps the signal on node 120 to ground permits the use of a smaller MOS device 117. This minimizes the leakage current from ground through the MOS device 117 to node 120 when the signal on node 120 is at the substrate potential. Leakage will occur if the MOS device 117 operates with a depletion threshold. The positive swing on node 121 clamps the signal on node 120 to ground permitting the full voltage swing to be transferred to the substrate.

Finally, the MOS device 92 is sized small compared to the MOS device 118 in order to pull the signals on nodes 86 and 120 down slowly, thus minimizing the swing of the signal on node 120 below the substrate potential. This arrangement prevents the parasitic diodes from going sufficiently negative and injecting electrons into the substrate.

In the above description, specific details of an embodiment of the invention have been provided for a thorough understanding of the inventive concepts. It will be understood by those skilled in the art that many of these details may be varied without departing from the spirit and scope of the invention.

What is claimed is:

1. A substrate bias generator for generating a regulated substrate voltage for an MOS integrated circuit which includes a power supply voltage and MOS devices having inherent threshold voltage conduction points, said generator comprising:

means for generating first and second trains of periodic pulses such that said first train of pulses and said second train of pulses are approximately phase opposite;

means for generating a target reference voltage;

and pumping means receiving said first and said second trains of pulses and said target voltage for initially transferring a charge into the substrate to raise the substrate voltage and thereafter transferring charge out of the substrate to reduce the substrate voltage, the charge transferred out of the substrate being greater than the charge transferred into the substrate when the absolute value of the potential on the substrate is less than the target voltage, the charge transferred out of the substrate being less than the charge transferred into the substrate when the absolute value of the potential on the substrate is greater than the target voltage, whereby the absolute value of the potential on the substrate is driven towards the target voltage.

2. The substrate bias generator of claim 1 wherein said pulse generating means includes:

an oscillator initiating its operation at a low power supply voltage for generating a first AC signal having cyclic transitions between a voltage close to ground and the power supply voltage and for generating an oscillator reference voltage signal having a value approximately one-half of the power supply voltage;

buffer circuitry receiving said first signal and said oscillator reference voltage signal for generating a second signal, said second signal being slightly delayed but approximately phase synchronous with the transitions of said first signal and having cyclic transitions between ground and said power supply voltage; and driver means receiving said second signal for generating said first and second trains of periodic pulses.

3. The substrate bias generator of claim 2 wherein said oscillator includes means for initiating oscillator operation and means for avoiding a stable operating point when the power supply voltage reaches a level of two threshold volts above ground.

4. The substrate bias generator of claim 2 wherein said first signal as a minimum voltage level of several hundred millivolts above ground.

5. The substrate bias generator of claim 1 wherein said pumping means including a push-pull driver means and a pumping stage, said push-pull driver means being coupled to said target reference voltage and receiving said first and second trains of periodic pulses for generating first, second, and third pumping trains of periodic pulses for application to said pumping stage, said pumping stage being responsive to the voltage transitions of said pumping trains for initially transferring charge into the substrate to raise the substrate voltage and thereafter transferring charge out of the substrate to reduce the substrate voltage.

6. The substrate bias generator of claim 5 wherein said push-pull driver means includes five push-pull drivers, said first push-pull driver being coupled to said target reference voltage and receiving said first and second trains of periodic pulses for generating said first pumping train of periodic pulses, said first pumping train of periodic pulses having cyclic transitions between ground and a voltage which is one threshold voltage below the voltage of said target reference voltage;

said second push-pull driver receiving said first and second trains of periodic pulses for generating a first driver signal;

said third push-pull driver receiving said second train of periodic pulses and said first driver signal for generating a second driver signal;

said fourth push-pull driver receiving said first and second trains of periodic pulses and said second driver signal for generating said second pumping train of periodic pulses;

said fifth push-pull driver receiving said second train of periodic pulses and said first driver signal for generating said third pumping train of periodic pulses.

7. The substrate bias generator of claim 5 wherein said pumping stage includes:

a first depletion mode MOS device for capacitively coupling said first pumping train of periodic pulses to a first node;

a second depletion mode MOS device for capacitively coupling said second pumping train of periodic pulses to a second node;

a third depletion mode MOS device for capacitively coupling said third pumping train of periodic pulses to a third node;

a first enhancement mode MOS device having its drain-source current path coupled between said first and second nodes and having its gate biased to ground for coupling the potential on said second node towards the potential on said first node when the potentials on both said first and second nodes are negative and the potential on said third node is at least a threshold voltage below ground;

a second enhancement mode MOS device having its drain-source current path coupled between said first node and ground and having its gate coupled to said second node for clamping said first node to ground during the high cycle portion of said second pumping train of periodic pulses;

a third enhancement mode MOS device coupled between said first node and the substrate and having its gate coupled to said third node; and resistor means coupled between the substrate and said third node for enabling the potential on said third node to slowly leak to the substrate potential;

said third enhancement mode MOS device being activated for transferring positive charge back and forth between the substrate and said first node when the potential on said third node is more than a threshold voltage above the potential on the substrate; and said third enhancement mode MOS device inhibiting transfer of charge between the substrate and said first node when the potential on said third node is more negative than a threshold voltage above the potential on the substrate.

* * * * *